US007492663B2

(12) United States Patent
Fukano et al.

(10) Patent No.: US 7,492,663 B2
(45) Date of Patent: Feb. 17, 2009

(54) STORAGE DEVICE WITH PROTECTION AGAINST INADVERTENT WRITING

(75) Inventors: Takakazu Fukano, Nagano-ken (JP); Noboru Asauchi, Nagano-ken (JP); Tomio Yokoyama, Nagano-ken (JP); Mitsuto Yanagisawa, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 717 days.

(21) Appl. No.: 11/017,206

(22) Filed: Dec. 21, 2004

(65) Prior Publication Data

US 2005/0237355 A1 Oct. 27, 2005

(30) Foreign Application Priority Data

Dec. 26, 2003 (JP) ............................ 2003-433048

(51) Int. Cl.
*G11C 8/00* (2006.01)

(52) U.S. Cl. ...................................................... 365/233

(58) Field of Classification Search ................. 365/233, 365/239; 347/19; 358/1.16
See application file for complete search history.

(56) References Cited

U.S. PATENT DOCUMENTS 5,410,262 A * 4/1995 Kang ......................... 327/108
6,693,450 B1 * 2/2004 Volk et al. .................... 326/30
6,749,281 B2 * 6/2004 Asauchi ....................... 347/19
2002/0016893 A1 2/2002 Asauchi
2007/0279690 A1 * 12/2007 Asauchi ..................... 358/1.16

FOREIGN PATENT DOCUMENTS

JP 06-348376 A 12/1994
JP 2002-14870 A 1/2002

* cited by examiner

*Primary Examiner*—Connie C Yoha
(74) *Attorney, Agent, or Firm*—Sughrue Mion, PLLC

(57) ABSTRACT

The present invention provides a storage device. The storage device includes a reset signal terminal, a clock signal terminal, a non-volatile memory, and a pull down resistance. The reset signal terminal is electrically connected to external equipment at a contact point, for receiving a reset signal. The clock signal terminal is electrically connected to the external equipment at a contact point, for receiving a clock signal. The data signal terminal is electrically connected to the external equipment at a contact point, for sending and receiving a data signal. The pull down resistance is connected to a lower side of electric potentials used by the storage device, at one terminal of the pull down resistance. The controller is initialized in response to the reset signal. The controller also writes to and reads from the non-volatile memory according to the clock signals and the data signals. The data signal includes a signal configured to raise a voltage of the data signal terminal to a higher side of the electric potentials, for instructing to write to the non-volatile memory. The data signal terminal is connected to the other terminal of the pull down resistance.

8 Claims, 6 Drawing Sheets

STORAGE DEVICE WITH PROTECTION AGAINST INADVERTENT WRITING

BACKGROUND OF THE INVENTION

1. Field of the Invention

The present invention relates to control of memory reading and writing.

2. Description of the Related Art

For ink cartridges which are an expendable supply of an inkjet printer, for example as disclosed in Patent publication No. 2002-14870, equipped is a non-volatile memory that stores the remaining volume of expendable supplies as well as other attribute information. For information stored in the non-volatile memory, for example, there are items written by the inkjet printer such as the remaining volume of the expendable supplies. This is because the data that shows the remaining volume of expendable supplies is to be updated according to ink consumption by the inkjet printer. For this kind of ink cartridge, there are also items which use a connector terminal to make an electrical connection with the inkjet printer.

However, this kind of connector terminal has problems such as poor contact and signal reflection, which cause erroneous writing in relation to the ink cartridge. Furthermore, this problem is not limited to ink cartridges, but is a problem that also can occur with expendable supply containers in general that hold toner and other expendable supplies.

SUMMARY OF THE INVENTION

The present invention was created to solve the problems described above for the prior art, and its purpose is to provide technology for reducing erroneous writing for a storage device that is electrically connected by a contact point with an external equipment.

The present invention provides a first configuration of storage device. The first configuration of storage device includes a reset signal terminal, a clock signal terminal, a non-volatile memory, and a pull down resistance. The reset signal terminal is electrically connected to external equipment at a contact point, for receiving a reset signal. The clock signal terminal is electrically connected to the external equipment at a contact point, for receiving a clock signal. The data signal terminal is electrically connected to the external equipment at a contact point, for sending and receiving a data signal. The pull down resistance is connected to a lower side of electric potentials used by the storage device, at one terminal of the pull down resistance. The controller is initialized in response to the reset signal. The controller also writes to and reads from the non-volatile memory according to the clock signals and the data signals. The data signal includes a signal configured to raise a voltage of the data signal terminal to a higher side of the electric potentials, for instructing to write to the non-volatile memory. The data signal terminal is connected to the other terminal of the pull down resistance.

With the storage device of the first configuration of the present invention, a data signal contains signals that give instructions to write to the non-volatile memory with the electric potential of the data signal terminal as high electric potential, and also the data signal terminal is connected to a pull down resistance. By doing this, it is possible to make it difficult for problems to occur such as the data signal terminal going to a high electric potential inadvertently due to poor contact or signal reflection, so there is low potential for the storage device to erroneously receive write instructions.

For poor contact, an oscillation phenomenon due to inadvertent disconnect is particularly a problem. However, the pull down resistance functions so as to immediately put the data signal terminal on the low electric potential side after disconnecting, so a signal which gives instructions to write to the non-volatile memory which has the electric potential of the data signal terminal as high electric potential is not received. As a result, erroneous writing to the non-volatile memory due to poor contact is reduced.

Signal reflection is a problem that occurs due to input impedance of the data signal terminal. This problem can be the cause of inadvertent write instructions with unintended generation of high electric potential at the data signal terminal. This kind of reflection can also be reduced by pull down resistance.

Note that the method of connecting between the storage device and external equipment may be a bus connection or may also be a discrete connection.

The present invention provides a second configuration of storage device. The second configuration of storage device includes a reset signal terminal, a clock signal terminal, a non-volatile memory, and a pull up resistance. The reset signal terminal is electrically connected to external equipment at a contact point, for receiving a reset signal. The clock signal terminal is electrically connected to the external equipment at a contact point, for receiving a clock signal. The data signal terminal is electrically connected to the external equipment at a contact point, for sending and receiving a data signal. The pull up resistance is connected to a higher side of electric potentials used by the storage device, at one terminal of the up down resistance. The controller is initialized in response to the reset signal. The controller also writes to and reads from the non-volatile memory according to the clock signals and the data signals. The data signal includes a signal configured to decrease a voltage of the data signal terminal to a lower side of the electric potentials, for instructing to write to the non-volatile memory. The data signal terminal is connected to the other terminal of the pull up resistance.

With the storage device of the second configuration of the present invention, a data signal contains signals that give instructions to write to the non-volatile memory with the electric potential of the data signal terminal as low electric potential, and also, the data signal terminal is connected to a pull down resistance. As with the first embodiment, this configuration is also able to reduce erroneous writing caused by poor contact. However, this configuration is able to reduce erroneous write by preventing the occurrence of inadvertent low electric potential due to noise included in the signal.

Note that the present invention can be realized in various formats such as a storage device and telecommunication device, a computer program that performs the methods thereof or the function of the device on a computer, a recording medium on which that computer program is recorded, data signals implemented within a carrier wave that includes the computer program, or a computer program product, etc.

DESCRIPTION OF THE PREFFERED EMBODIMENTS

Figure 1:
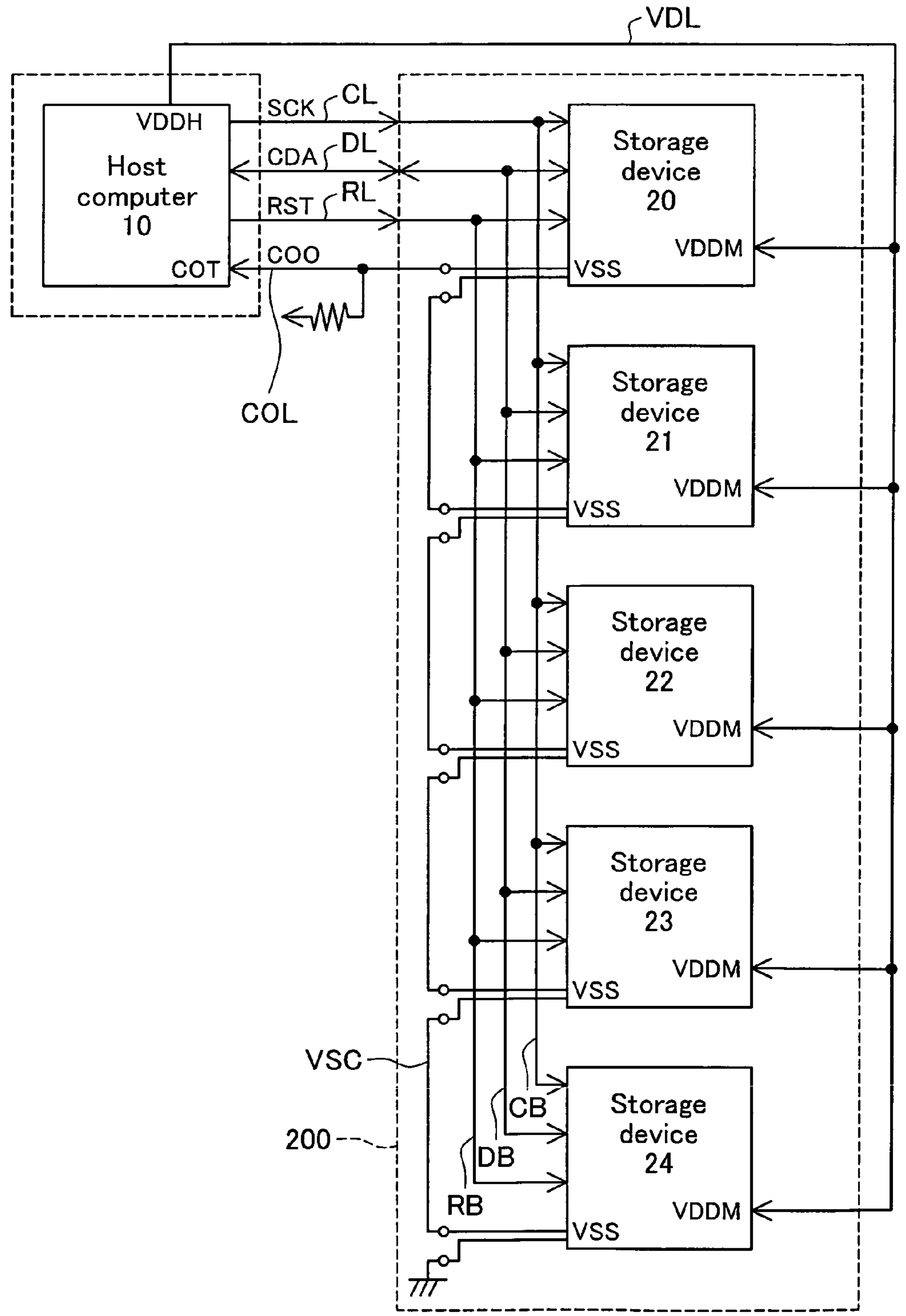
FIG. 1 is an explanatory diagram that shows an example of configuration of a storage system that includes a plurality of storage devices and a host computer for an embodiment of the present invention.

A. Configuration of the Device:

FIG. 1 is an explanatory diagram that shows an example of the configuration of a storage system that includes a plurality of storage devices and a host computer for an embodiment of the present invention. This storage system comprises a host computer 10, and a memory module substrate 200 that has five storage devices 20, 21, 22, 23, and 24.

The host computer 10 and the memory module substrate 200 are connected with a power supply line VDL, a clock signal line CL, a data signal line DL, a reset signal line RL, and a cartridge out signal line COL. These lines may be mounted as flexible feed cable (FFC), for example.

The power supply line VDL is connected respectively to the five storage devices 20, 21, 22, 23, and 24. The clock signal line CL, the data signal line DL, and the reset signal line RL are connected by bus to each of the five storage devices 20, 21, 22, 23, and 24 respectively via a clock bus CB, a data bus DB, and a reset bus RB. The cartridge out signal line COL is connected in serial and grounded to two short circuited grounding connecting terminals VSS which each of the five storage devices 20, 21, 22, 23, and 24 have.

The power supply line VDL is a line for supplying power from the host computer 10 to each of the storage devices 20, 21, 22, 23, and 24. The clock signal line CL and the reset signal line RL are lines for sending the respective clock signal SCK and the reset signal RST from the host computer 10 to each of the storage devices 20, 21, 22, 23, and 24. The data signal line DL is a line for sending and receiving data and commands between the host computer 10 and each of the storage devices 20, 21, 22, 23, and 24. The cartridge out signal line COL is a line for the host computer 10 to receive a cartridge out signal CO.

Figure 2:
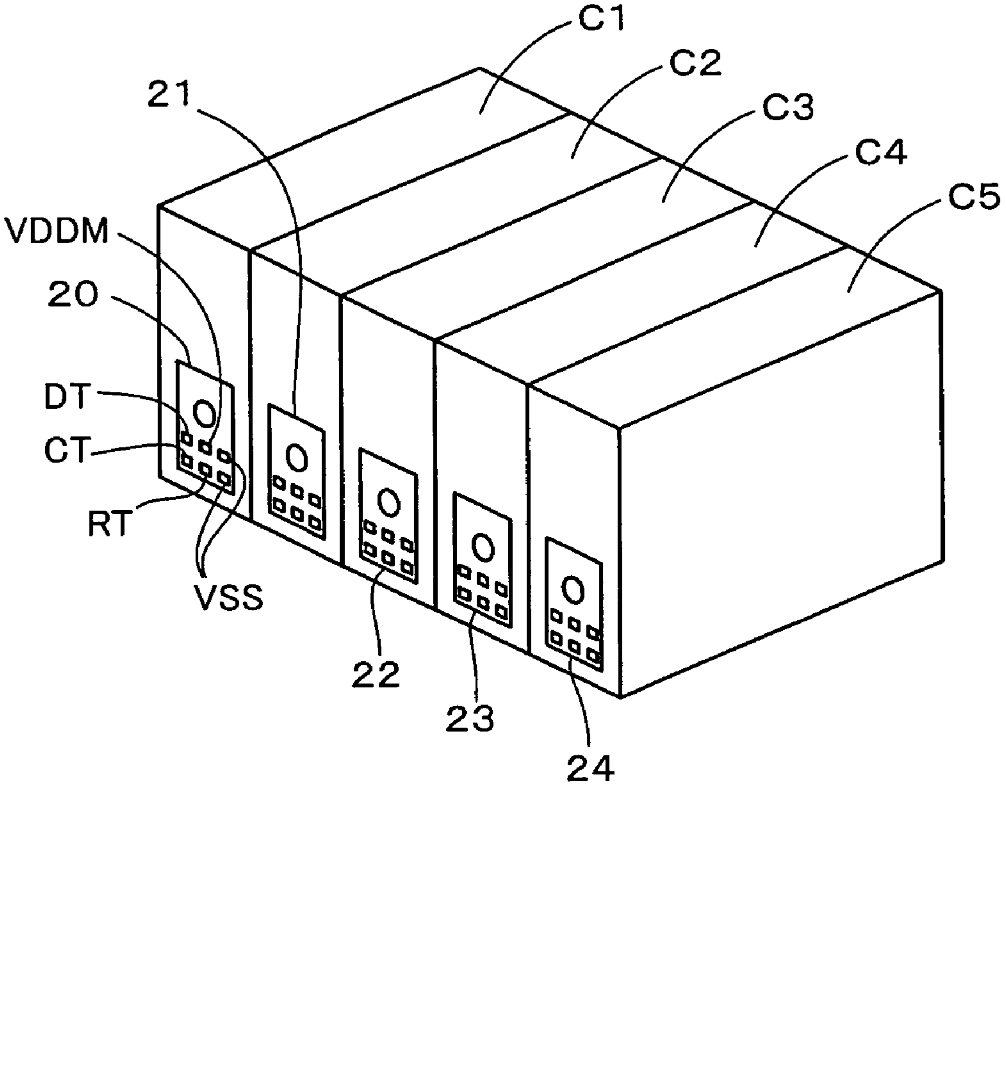
FIG. 2 is a perspective view that shows the external appearance of a storage device for an embodiment of the present invention.

FIG. 2 is a perspective view that shows the external appearance of the storage devices 20, 21, 22, 23, and 24 for an embodiment of the present invention. With this embodiment, each of the storage devices 20, 21, 22, 23, and 24 is respectively equipped with five color ink cartridges C1, C2, C3, C4, and C5 for the inkjet printer. In the five color ink cartridges C1, C2, C3, C4, and C5 are stored each color of ink such as cyan, light cyan, magenta, light magenta, and yellow, for example. Also, with this embodiment, an EEPROM that is able to hold storage contents in a non-volatile manner and at the same time is able to rewrite the storage contents is used as a storage component.

Figure 3:
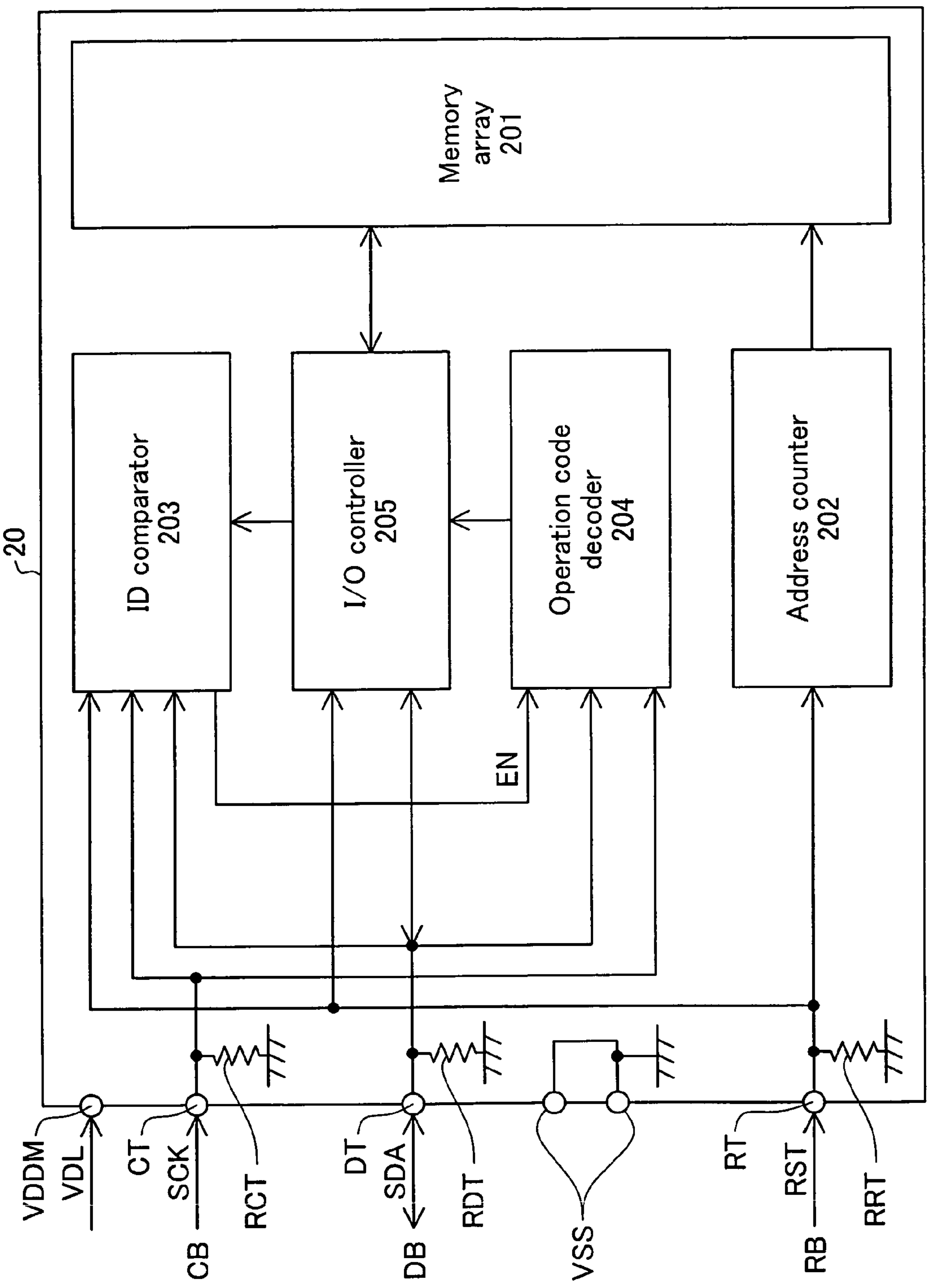
FIG. 3 is a block diagram that shows the internal circuit configuration of the storage device 20 for an embodiment of the present invention.

FIG. 3 is a block diagram that shows the internal circuit configuration of the storage device 20 for an embodiment of the present invention. The storage device 20 comprises as a storage component a memory array 201, an ID comparator 203, an I/O controller 205, an operation code decoder 204, and an address counter 202. The storage device 20 is connected to the power supply line VDL via a power supply positive electrode terminal VDDM. Also, via the clock signal terminal CT, the data signal terminal DT, and the reset signal terminal RT, these are respectively bus connected respectively to the clock bus CB, a data bus DB, and a reset bus RB. Note that the storage devices 21, 22, 23, and 24 have the same configuration as the storage device 20.

Connected to the clock signal terminal CT is a clock signal terminal pull down resistance RCT, and connected to the data signal terminal DT and the reset signal terminal RT are respectively the data signal terminal pull down resistance RDT and the reset signal terminal pull down resistance RRT. We will describe the role of these pull down resistances RCT, RDT, and RRT later. Note that with this specification, "resistance" may be something for which the potential difference is generated according to the current, for example a transistor may be used.

The address counter 202 is a circuit which is synchronized with the clock signal SCK and for which its counter value is incremented. The counter value is associated with the storage area position (address) of the memory array 201. In this way, with this embodiment, the write position and read position for the memory array 201 are specified sequentially.

Figure 4A:
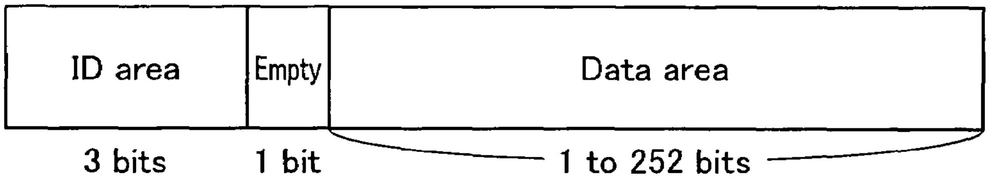
FIGS. 4(*a*) and 4(*b*) show the storage area of the memory array 201 and a data field that the storage device receives from and the host computer 10.
Figure 4B:
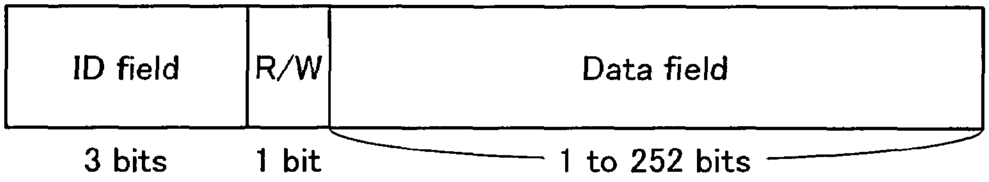

With this embodiment, the memory array 201 has a 256-bit storage area like that shown in FIG. 4(*a*). This storage area is segmented into a storage area (3 bits from the start) for identification data storage, an empty area (4th bit from the start), and a data storage area (5th bit from the start and thereafter). The ink consumption volume and other information are stored in the data storage area. This storage area is formed so as to handle the data fields (FIG. 4(*b*)) that are received by the storage device from the host computer 10 that are read and written sequentially.

The data field (FIG. 4(*b*)) that is received by the storage device from the host computer 10 is segmented into an identification data sending field (3 bits from the start), a write/read command sending field (4th bit from the start), and a data sending field (5th bit from the start and thereafter).

The ID comparator 203 determines whether or not the identification data contained in the data series input via the data signal terminal DT from the host computer 10 matches the identification data stored in the memory array 201. When both identification data match, the ID comparator 203 sends an access allowed signal EN to the operation code decoder 204.

When it receives the access allowed signal EN, the operation code decoder sends a write processing request or a read processing request to the I/O controller 205 according to the acquired write/read command.

The I/O controller 205 performs control of the switching of the data transfer direction for the memory array 201 according to the request from the operation code decoder 204. The I/O controller 205 is further equipped with a buffer memory (not illustrated) that temporarily stores transferred data.

B. Contents of Processing Performed by the Storage Device

Figure 5:
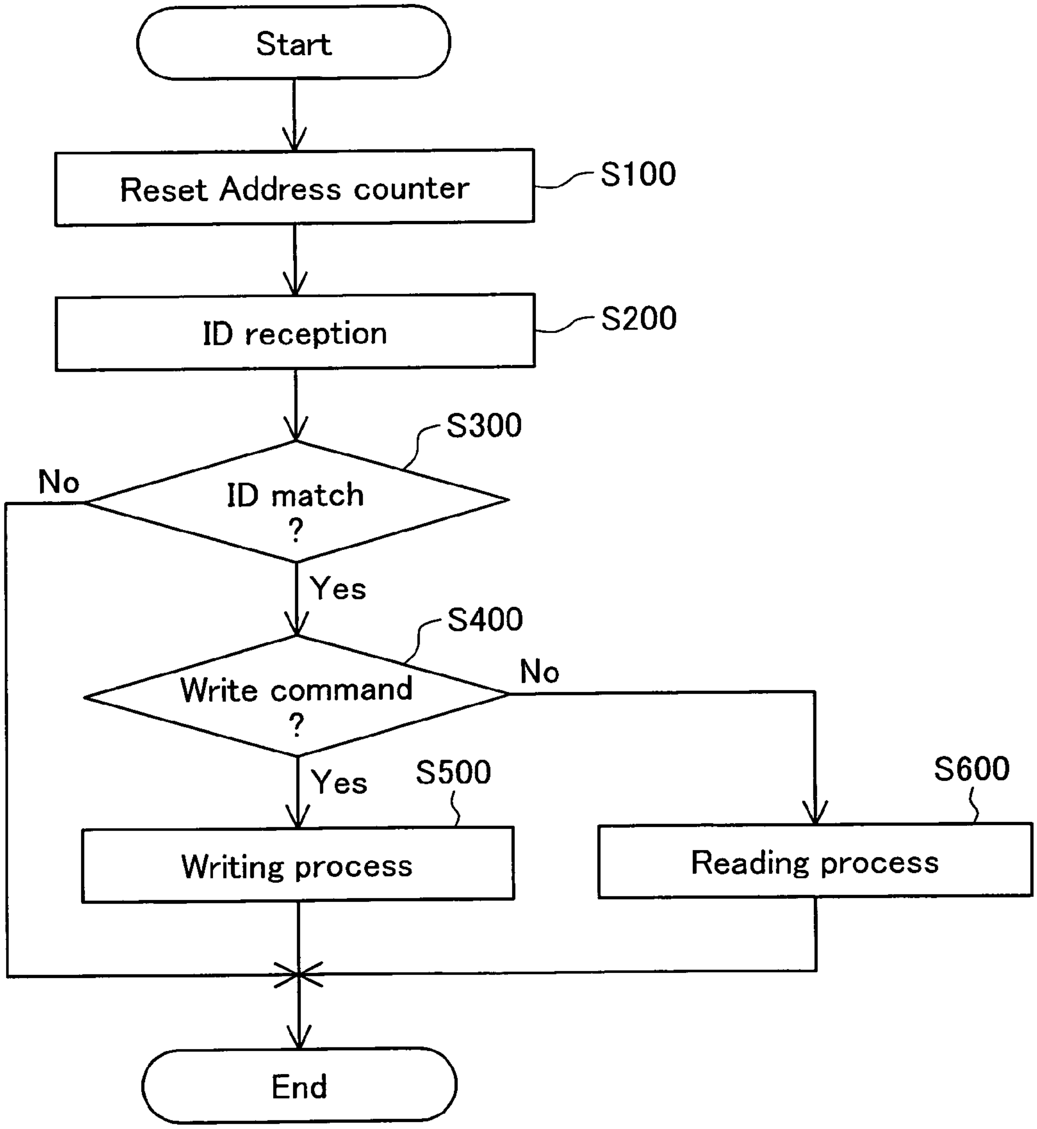
FIG. 5 is a flow chart that shows the contents of processing that is performed by each storage device 20, 21, 22, 23, and 24 for an embodiment of the present invention.
Figure 6:
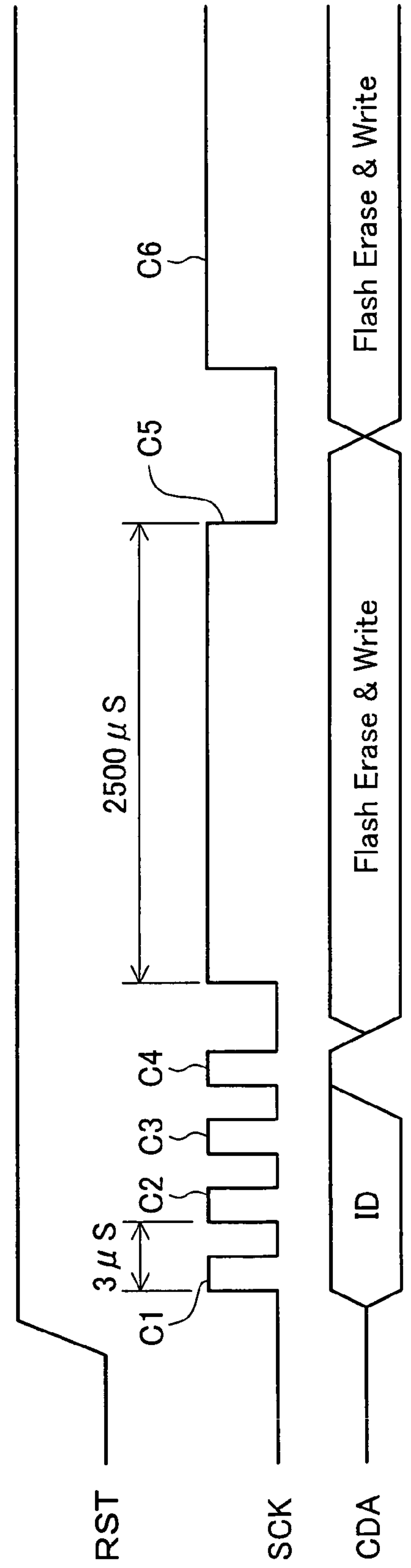
FIG. 6 is a timing chart that shows the time relationship of the reset signal RST, the clock signal SCK, and the data signal CDA for an embodiment of the present invention.

FIG. 5 is a flow chart that shows the contents of the process that is performed by each of the storage devices 20, 21, 22, 23, and 24 for an embodiment of the present invention. FIG. 6 is a timing chart that shows the time relationship of the reset signal RST, the clock signal SCK, and the data signal CDA for an embodiment of the present invention. The clocks C1 to C6 are respectively the 1st to 6th clock pulses after the reset signal RST of each goes to high.

Each of the storage devices 20, 21, 22, 23, and 24 performs the following processing passively according to the signals from the host computer 10.

At step S100, the address counter 202 (FIG. 3) of each of the storage devices 20, 21, 22, 23, and 24 returns the counter value to the initial value. This process is performed according to receiving of the reset signal RST (FIG. 6) from the host computer 10. By doing this, each of the storage devices 20, 21, 22, 23, and 24 are in a state for which receiving and processing of data from the host computer 10 are possible.

At step S200, the ID comparator of each of the storage devices 20, 21, 22, 23, and 24 reads identification data contained in the 3 bits from the start (identification data sending field (FIG. 4(*b*))) of the data received from the host computer 10. Read control is performed by the I/O controller 205.

At step S300, the ID comparator of each of the storage devices 20, 21, 22, 23, and 24 determines whether or not the received identification data matches the identification data stored in the storage area for storing identification data of the memory array 201 (FIG. 4(*a*)). As a result of this determination, processing is completed for storage devices for which the ID did not match of the storage devices 20, 21, 22, 23, and 24, and this goes to standby until a new reset signal RST is received.

Meanwhile, for storage devices for which the ID did match, the ID comparator 203 sends an access allowed signal EN to the operation code decoder 204, and this makes the read and write processes possible. With this kind of process, the host computer 10 is able to specify a storage device to be subject to read and write. With this specification, we will continue the explanation with the ID of the storage device 20 matching.

At step S400, the operation code decoder 204 advances with the process of either the process of writing data to the memory array 201 or the process of reading data from the memory array 201 according to the command of the 4th bit from the start (write/read command sending field).

When the received command is a read command, the operation code decoder 204 of the storage device 20 reads data from the memory 201 and makes a request to the I/O controller 205 for a data transfer direction that allows transfer to the host computer 10. The reading of data from the memory 201 starts according to this (step S600).

When the received command is a write command, the operation code decoder 204 of the storage device 20 makes a request to the I/O controller 205 for a data transfer direction that allows transfer of data received from the host computer 10 to the memory 201. The writing of data to the memory 201 starts according to this (step S500). With this embodiment, the write command is sent by having the electric potential of the data signal terminal be high electric potential at the 4th bit from the start.

The I/O controller 205 performs “erase processing” and “storage processing” for each bit with 2500 μS of time spent. This time is the time required by an EEPROM for erase processing and storage processing.

In this way, if there is not poor contact between the terminals of each of the storage devices 20, 21, 22, 23, and 24, which are the clock signal terminal CT, the data signal terminal DT, and the reset signal terminal RT, and the buses which are the clock bus CB, the data bus DB, and the reset bus RB, then it is possible to perform normal reading and writing.

C. Role of Pull Down Resistance:

The storage device 20 (FIG. 3) is equipped with a data signal terminal pull down resistance RDT. This pull down resistance is provided to prevent erroneous writing due to inadvertent writing to the storage device 20. The data signal terminal pull down resistance RDT has two functions. The first function is to reduce erroneous writing due to poor contact. The second function is to reduce erroneous writing due to signal reflection.

Erroneous writing due to poor contact may occur in the following way, for example. Poor contact is a cause of inadvertent disconnect during sending and receiving. This inadvertent disconnect can cause an oscillation phenomenon. As a result, this causes erroneous receiving of unintended write instructions.

The data signal terminal pull down resistance RDT can immediately converge the oscillation and have a low electric potential for the data signal terminal. By doing this, it is able to lower the possibility of the data signal terminal erroneously receiving a write instruction set to the high electric potential side.

Erroneous writing due to signal reflection occurs when the data signal terminal unintentionally goes to high electric potential due to reflection. The data signal terminal pull down resistance RDT can also reduce this kind of reflection, so it is able to reduce the possibility of the data signal terminal erroneously receiving a write instruction set to the high electric potential side.

Note that with this embodiment, a clock signal terminal pull down resistance RCT and a reset signal terminal pull down resistance RRT are also provided. The reason that these pull down resistances are provided is because it is more desirable to stabilize the clock signals and reset signals for transmission. Furthermore, by doing this, the electric potential of each terminal is stabilized immediately after receiving, so there is also the advantage of being able to quickly output permission to remove the ink cartridge immediately after sending and receiving data.

In this way, with this embodiment, the configuration is made so that the signals that give write instructions to the non-volatile memory have high electric potential for the electric potential of the data signal terminal, and also since it is configured so that the data signal terminal does not inadvertently go to the high electric potential side due to the data signal terminal pull down resistance RDT, it is possible to reduce erroneous writing to the non-volatile memory.

D. Variation Examples:

Note that the present invention is not limited to the embodiments and embodiments noted above, and it is possible to implement this in a variety of formats without straying from the scope of the key points, with the following variations being possible, for example.

D-1. With the embodiment described above, this is configured so that the signal that gives instructions to write to the non-volatile memory has the electric potential of the data signal terminal as high electric potential, and the data signal terminal is connected to the pull down resistance, but it is also possible to configuration this such that the signal that gives instructions to write to the non-volatile memory has the electric potential of the data signal terminal as low electric potential, and to configuration it such that the data signal terminal is connected to pull up resistance. Either of these has the effect of converging the oscillation phenomenon, but as described previously, the former has the advantage of being able to reduce reflection, and the latter has the advantage of being able to reduce erroneous operation due to noise contained in the signals.

D-2. With the embodiment described above, the memory array 201 is flash memory or other memory that requires erase processing, but it is also possible to have a memory that can do overwrite but does not require erase processing such as MRAM or FeRAM, for example.

When realizing part or all of the functions of the present invention using software, it is possible to provide that software (computer program) in a form stored on a recording medium that can be read by a computer. For this invention, a “recording medium that can be read by a computer” is not limited to a portable type recording medium such as a flexible disk or a CD-ROM, but also includes internal recording devices within the computer such as various types of RAM and ROM, etc., as well as external storage devices fixed to a computer such as a hard disk.

Finally, the Japanese patent application which is the basis for the priority claim of this application (Patent Application No. 2003-433048 (application date: Dec. 26, 2003)) is disclosed herein for reference.

What is claimed is:

1. A storage device comprising:

a reset signal terminal configured to be electrically connected to external equipment at a contact point, for receiving a reset signal;

a clock signal terminal configured to be electrically connected to the external equipment at a contact point, for receiving a clock signal;

a data signal terminal configured to be electrically connected to the external equipment at a contact point, for sending and receiving a data signal;

a non-volatile memory;

a pull down resistance configured to be connected to a lower side of electric potentials used by the storage device, at one terminal of the pull down resistance; and a controller configured to be initialized in response to the reset signal, and also to write to and to read from the non-volatile memory according to the clock signals and the data signals, wherein the data signal includes a signal configured to raise a voltage of the data signal terminal to a higher side of the electric potentials, for instructing to write to the non-volatile memory, wherein the data signal terminal is connected to the other terminal of the pull down resistance;

said storage device further comprising a first resistance configured to generate a potential difference according to a electrical current, wherein the reset signal terminal is connected to one of the higher side and the lower side of the electric potentials via the first resistance.

2. The storage device according to claim 1, further comprising a second resistance configured to generate a potential difference according to a electrical current, wherein the clock signal terminal is connected to one of the higher side and the lower side of the electric potentials via the second resistance.

3. An expendable supply container, comprising:

the storage device according to claim 1, and an expendable supply storage unit configured to store the expendable supply.

4. The expendable supply container according to claim 3, wherein the expendable supply is an ink to be supplied to an inkjet printer.

5. A storage device comprising:

a reset signal terminal configured to be electrically connected to external equipment at a contact point, for receiving a reset signal;

a clock signal terminal configured to be electrically connected to the external equipment at a contact point, for receiving a clock signal;

a data signal terminal configured to be electrically connected to the external equipment at a contact point, for sending and receiving a data signal;

a non-volatile memory;

a pull up resistance configured to be connected to a higher side of electric potentials used by the storage device, at one terminal of the pull up resistance; and a controller configured to be initialized in response to the reset signal, and also to write to and to read from the non-volatile memory according to the clock signals and the data signals, wherein the data signal includes a signal configured to decrease a voltage of the data signal terminal to a lower side of the electric potentials, for instructing to write to the non-volatile memory, wherein the data signal terminal is connected to the other terminal of the pull up resistance;

said storage device further comprising:

a first resistance configured to generate a potential difference according to a electrical current, wherein the reset signal terminal is connected to one of the higher side and the lower side of the electric potentials via the first resistance.

6. The storage device according to claim 5, further comprising a second resistance configured to generate a potential difference according to a electrical current, wherein the clock signal terminal is connected to one of the higher side and the lower side of the electric potentials via the second resistance.

7. An expendable supply container, comprising:

the storage device according to claim 5; and an expendable supply storage unit configured to store the expendable supply.

8. The expendable supply container according to claim 7, wherein the expendable supply is an ink to be supplied to an inkjet printer.

* * * * *